United States Patent
Yamada

(10) Patent No.: US 8,437,989 B2
(45) Date of Patent: May 7, 2013

(54) CIRCUIT SIMULATION METHOD

(75) Inventor: Kenta Yamada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 357 days.

(21) Appl. No.: 12/884,556

(22) Filed: Sep. 17, 2010

(65) Prior Publication Data
US 2011/0066410 A1    Mar. 17, 2011

(30) Foreign Application Priority Data
Sep. 17, 2009    (JP) ................. 2009-215974

(51) Int. Cl.
*G06F 7/60*    (2006.01)
*G06F 17/10*    (2006.01)

(52) U.S. Cl.
USPC ............................................. 703/2

(58) Field of Classification Search ........ 703/2
See application file for complete search history.

(56) References Cited

FOREIGN PATENT DOCUMENTS
JP    7-049897    2/1995

OTHER PUBLICATIONS

Larsson "Parasitic Resistance in an MOS Transistor Used as On-Chip Decoupling Capacitance" IEEE Apr. 1997.*

* cited by examiner

*Primary Examiner* — Saif Alhija
(74) *Attorney, Agent, or Firm* — Young & Thompson

(57) ABSTRACT

A exemplary aspect of the present invention is a simulation method for a semiconductor circuit that includes: a well resistor comprising a terminal region and a main body; and a plurality of contacts formed above the terminal region, the simulation method comprising: modeling a parasitic resistance $Rt0$ of the terminal region between the plurality of contacts and the main body by the following formula, where $\rho_0, L'_0, W'_0$ are fitting parameters; $L'$ is a length of the terminal region in the longitudinal direction of the well resistor; and $W'$ is a width of the terminal region in the width direction of the well resistor.

$$Rt0 = \rho_0 \times \frac{(L' + L'_0)}{L' \times (W' + W'_0)}$$

6 Claims, 6 Drawing Sheets

$R_{AB}=R_{AC}=Ra+Rb=Rt0$

CIRCUIT SIMULATION METHOD

INCORPORATION BY REFERENCE

This application is based upon and claims the benefit of priority from Japanese patent application No. 2009-215974, filed on Sep. 17, 2009, the disclosure of which is incorporated herein in its entirety by reference.

BACKGROUND

1. Field of the Invention

The present invention relates to a circuit simulation method, and more particularly, to a circuit simulation method for a circuit having a well resistor.

2. Description of Related Art

Along with miniaturization of semiconductor integrated circuits, an area of logic circuits is reduced, whereas, an area of analog circuits is not necessarily reduced. Therefore, reduction of the area of analog circuits has become an increasingly critical issue for cost reduction. A cause of an impediment to reducing the area of analog circuits is that it is difficult to reduce the area of resistors. Here, a terminal region (an opening) of a well resistor is connected to a wiring line through a tap and a plurality of contacts which are regularly arranged on the tap. It is difficult to estimate the value of a resistance of the terminal region of the resistor (hereinafter referred to as "terminal parasitic-resistance") precisely.

When there is an estimation error of the terminal parasitic-resistance, it is necessary to enlarge a margin for the estimation error or to design the layout in which the estimation error is negligible. In each case, the circuit area increases. In particular, a resistance of contacts which are one of major components of the terminal parasitic-resistance increases at an accelerated rate along with the recent miniaturization. Therefore, the terminal parasitic-resistance becomes large relative to a resistance of the main body of the resistor. Thus, the estimation error of the terminal parasitic-resistance has become an increasingly significant issue.

In general, to estimate the terminal parasitic-resistance, it is necessary to extract a complex parasitic-resistance net by using an LPE (Layout Parameter Extraction) tool after layout design. Further, to shorten a circuit simulation time, a circuit reduction needs to be performed by a sequential hand calculation or a circuit reduction tool. However, such methods require time and effort or include estimation errors due to an LPE tool.

When reviewing the circuit design after estimation using an LPE tool, the design efficiency is significantly lowered. Thus, in the circuit design stage before the layout design, the terminal parasitic-resistance is required to be estimated. In this case, since the LPE tool cannot be used, the terminal parasitic-resistance has simply been estimated up to now. Specifically, the terminal parasitic-resistance is considered to be inversely proportional to the area of the opening. As a similar attitude, in Japanese Unexamined Patent Application Publication No. 7-49897, the parasitic-resistance of the emitter of a bipolar transistor is modeled by being considered to be inversely proportional to the area of the opening of a diffusion layer.

SUMMARY

However, in fact, even if the opening of the well resistor is enlarged, a region far from the main body of the resistor does not contribute to reducing the terminal parasitic-resistance due to the parasitic-resistance of the resistor in the longitudinal direction, which may cause the estimation error. Finally, circuit simulation results after the layout design deviate from design values, and it is possibly necessary to review the circuit design and the layout design.

A exemplary aspect of the present invention is a simulation method for a semiconductor circuit that includes:
  a well resistor comprising a terminal region and a main body; and
  a plurality of contacts formed above the terminal region, the simulation method comprising:
    modeling a parasitic resistance Rt0 of the terminal region between the plurality of contacts and the main body by the following formula, where
    $\rho_0$, $L'_0$, $W'_0$ are fitting parameters;
    L' is a length of the terminal region in the longitudinal direction of the well resistor; and
    W' is a width of the terminal region in the width direction of the well resistor.

$$Rt0 = \rho_0 \times \frac{(L' + L'_0)}{L' \times (W' + W'_0)}$$

In the present invention, by introducing fitting parameters $\rho_0$, $L'_0$, and $W'_0$ based on physics consideration, the terminal parasitic-resistance Rt0 of the well resistor is precisely estimated.

According to the present invention, it is possible to provide a circuit simulation method capable of precisely estimating the terminal parasitic-resistance of the well resistor.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the accompanying drawings. Note that the present invention is not limited to exemplary embodiments described below. The following description and the accompanying drawings are appropriately simplified to clarify the explanation.

First Exemplary Embodiment

Figure 1A:
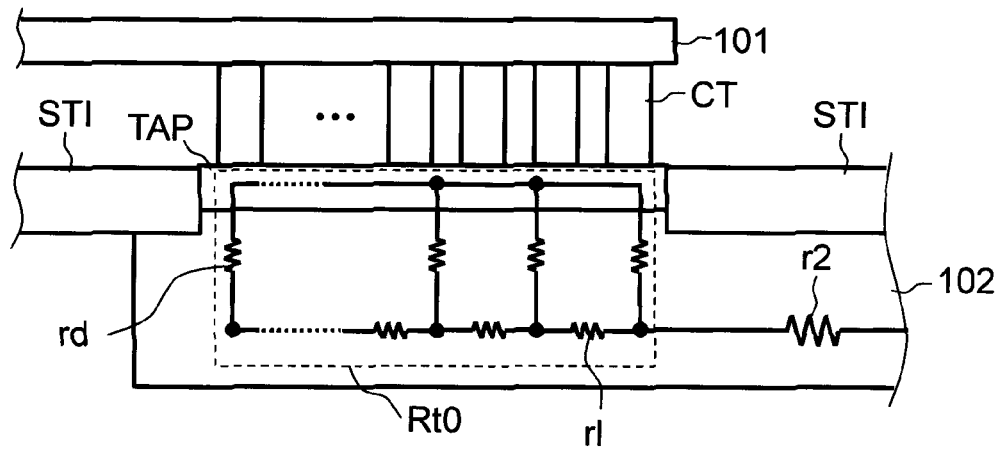
FIG. 1A is a longitudinal sectional view for explaining a terminal parasitic-resistance of a semiconductor resistor which is modeled in a circuit simulation method according to a first exemplary embodiment.

A terminal parasitic-resistance of a semiconductor resistor which is modeled in a circuit simulation method according to a first exemplary embodiment of the present invention is described hereinafter with reference to FIGS. 1A to 1D. FIG. 1A is a longitudinal sectional view for explaining a terminal parasitic-resistance of a semiconductor resistor which is modeled in the circuit simulation method according to a first exemplary embodiment. FIG. 1C is a cross-sectional view for explaining the terminal parasitic-resistance of the semiconductor resistor which is modeled in the circuit simulation method according to the first exemplary embodiment.

As shown in FIGS. 1A and 1C, an isolation layer STI is formed on a resistor 102. This isolation layer STI is formed almost all over the resistor 102. However, in a terminal region of the resistor 102 shown in FIGS. 1A and 1C, the isolation layer STI is not formed selectively, and an opening is formed. In this opening, a tap TAP is formed on the resistor 102. A plurality of contacts CT are formed on this tap TAP. Then, a wiring line 101 is formed on the contacts CT. Specifically, the resistor 102 is connected to the wiring line 101 through the tap TAP and the contacts CT.

Figure 1B:
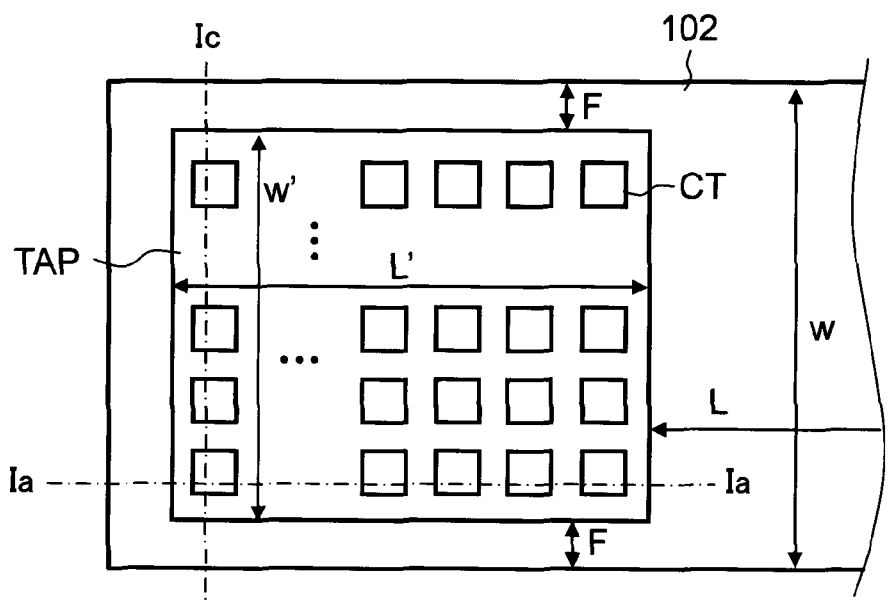
FIG. 1B is a plan view for explaining a terminal parasitic-resistance of a semiconductor resistor which is modeled in the circuit simulation method according to the first exemplary embodiment.
Figure 1C:
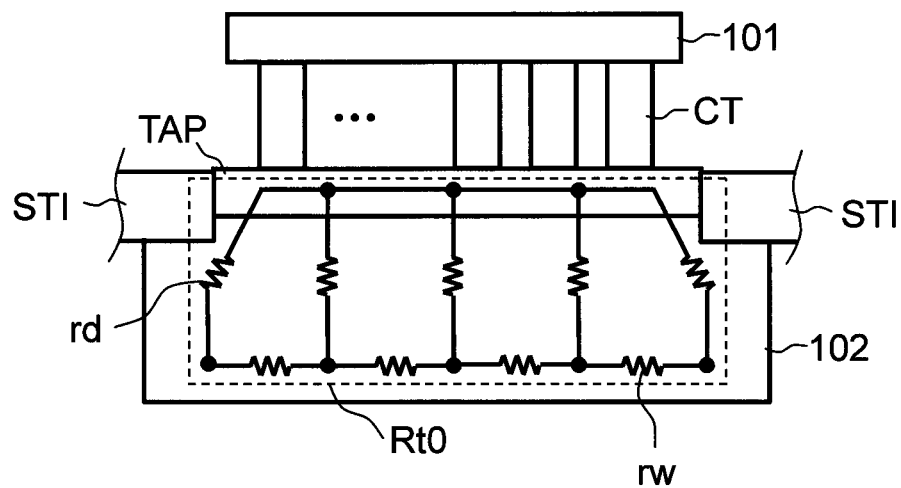
FIG. 1C is a cross-sectional view for explaining a terminal parasitic-resistance of a semiconductor resistor which is modeled in the circuit simulation method according to a first exemplary embodiment.

FIG. 1B is a plan view for explaining the terminal parasitic-resistance of the semiconductor resistor which is modeled in the circuit simulation method according to the first exemplary embodiment. As shown in FIG. 1B, the tap TAP with the width W' and the length L' is formed on the resistor 102 with the width W. Here, F represents a distance between the tap TAP and a side wall of the resistor 102. Thus, W=2×F+W'. Note that L represents the length of a main body of the resistor 102 except the terminal region. The matrix of contacts CT are arranged almost all over the tap TAP. When the terms "longitudinal direction" and "width direction" are used singly in this specification hereinafter, the terms respectively refer to the longitudinal direction and the width direction of the resistor 102.

Note that the wiring line 101 is omitted in FIG. 1B. FIG. 1A is a longitudinal sectional view taken along the line Ia-Ia of FIG. 1B. FIG. 1C is a longitudinal sectional view taken along the line Ic-Ic of FIG. 1B. Further, the resistor 102 according to the first exemplary embodiment has two terminal regions at both ends. Although only one terminal region is shown in the figures, the other terminal region has a structure similar to that of FIGS. 1A to 1C.

Here, the wiring line 101 is composed of a good conductor such as Cu (copper) or Al (aluminum). The resistor 102 is an N well resistor or a P well resistor. The tap TAP is a diffusion layer containing a higher level of impurities than the well. Although not shown, when the resistor 102 is an N well resistor, the resistor 102 is surrounded by a P type substrate or a P well. On the other hand, when the resistor 102 is a P well resistor, the resistor 102 is surrounded by an N type substrate or an N well. In this embodiment, assume that the resistor 102 is an N well resistor. The contacts CT are composed of W (tungsten), for example.

In FIGS. 1A and 1C, a schematic circuit diagram showing resistances of the terminal region and the main body of the resistor 102 is superimposed. Here, in FIGS. 1A and 1C, r2 represents a resistance of the main body of the resistor 102, r1 represents a parasitic-resistance of the terminal region of the resistor 102 in the longitudinal direction, rw represents a parasitic-resistance of the terminal region of the resistor 102 in the width direction, and rd represents a parasitic-resistance of the terminal region of the resistor 102 in the depth direction.

Figure 1D:
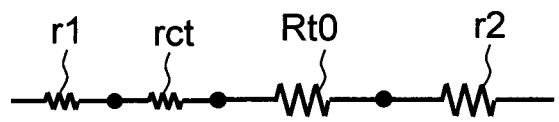
FIG. 1D is an equivalent circuit diagram of a terminal region of a semiconductor resistor which is modeled in the circuit simulation method according to the first exemplary embodiment.

FIG. 1D is an equivalent circuit diagram of a terminal parasitic-resistance Rt0 of the resistor 102 according to the first exemplary embodiment. One end of the terminal parasitic-resistance Rt0 is connected to one end of a total resistance rct of contacts CT. The other end of the terminal parasitic-resistance Rt0 is connected to the resistance r2 of the main body of the resistor 102. The other end of the total resistance rct of contacts CT is connected to the resistance r1 of the main body of the wiring line 101. The terminal parasitic-resistance Rt0 is composed of the resistance of the tap TAP, the parasitic-resistances r1, rw, rd of the resistor 102 in the terminal region, or the like.

As mentioned above, in the circuit simulation method according to the first exemplary embodiment, a complicated parasitic-resistance of the terminal region is modeled as a single terminal parasitic-resistance Rt0 by a model formula based on physics consideration. This makes it possible to realize a highly-accurate and high-speed circuit simulation. As a matter of course, the circuit simulation method according to the first exemplary embodiment is implemented by executing circuit simulation software on a circuit simulation apparatus (hardware).

Next, a model formula used for the circuit simulation method according to the first exemplary embodiment is described hereinafter. The model formula of the terminal parasitic-resistance Rt0 according to the first exemplary embodiment is given as the following formula (1).

$$Rt0 = \rho_0 \times \frac{(L' + L'_0)}{L' \times (W' + W'_0)} \quad (1)$$

Here, to explain physics consideration to reach the formula (1), a model formula in which the terminal parasitic-resistance Rt0 is considered to be simply inversely proportional to the area of the opening (L'×W') is shown below as a comparative example. If the resistivity of the N well composing the resistor 102 is ρ, and the thickness of the isolation layer STI is T, the model formula of the comparative example is given as the following formula (2).

$$Rt0 = \rho \times \frac{T}{L' \times W'} \quad (2)$$

As shown from the formula (2), the parasitic resistance r1 of the resistor 102 in the longitudinal direction is not considered. The resistivity ρ may be obtained from the impurity concentration of the N well, for example.

Figure 2:
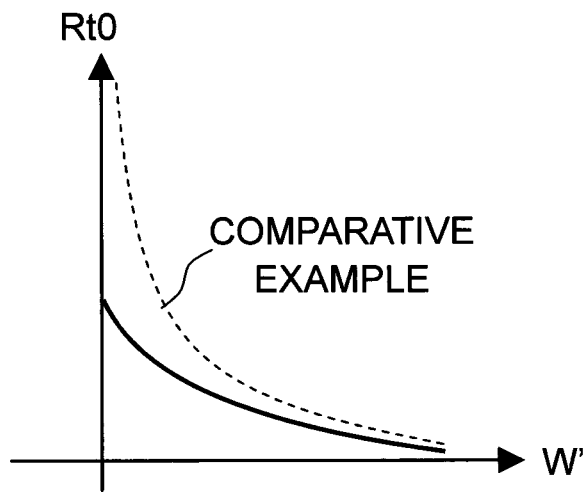
FIG. 2 is a graph schematically showing the dependency of the terminal parasitic-resistance Rt0 on the tap width W'.

In the formula (1), $W'_0$, $L'_0$, $\rho_0$ are fitting parameters. Specifically, these parameters are obtained by least squares approximation of the model formula (1) to measured data, for example. Firstly, the reason for introducing the fitting parameter $W'_0$ is described. As shown in FIG. 1C that shows a cross-sectional view of the resistor 102, the current flows not only immediately under the opening, or the tap TAP, but also near the side wall of the resistor 102. Therefore, the actual terminal parasitic-resistance Rt0 is smaller than the case that it is simply inversely proportional to the width W' of the tap TAP. Therefore, by introducing the fitting parameter $W'_0$ showing that the width W' of the tap TAP in the comparative example increases in appearance, the formula (1) may express the terminal parasitic-resistance Rt0 more precisely than the formula (2). FIG. 2 is a graph schematically showing the dependency of the terminal parasitic-resistance Rt0 on the tap width W'. Note that the distance F between the tap TAP and the side wall of the resistor 102 is a fixed value in the first exemplary embodiment. A broken line represents the formula (2) of the comparative example. Here, the terminal parasitic-resistance Rt0 is inversely proportional to the width W' of the tap TAP. On the other hand, a solid line represents the model formula (1) according to the first exemplary embodiment. The smaller the ratio of the width W' to the distance F becomes, the more pronounced the effect of the fitting parameter $W'_0$ becomes.

Next, reasons of introducing fitting parameters $L'_0$, $\rho_0$ are described. As shown in FIG. 1A, with regard to the parasitic resistance rd of the resistor 102 under the tap TAP in the depth direction, the farther from the main body of the resistor 102, the more the parasitic resistance r1 of the resistor 102 series-connected in the longitudinal direction. Therefore, when the length L' of the tap TAP increases to an extent, the region far from the main body of the resistor 102 may not contribute to reducing the terminal parasitic-resistance Rt0. In this case, if the terminal parasitic-resistance Rt0 is considered to be inversely proportional to the length L' of the tap TAP like the formula (2) of the comparative example, the terminal parasitic-resistance Rt0 is estimated to be too low. Then, the part expressed as T/L' in the formula (2) of the comparative example is changed to $(L'+L'_0)/L'$ in the model formula (1) according to the first exemplary embodiment. Explanations are made separately according to the length L' of the tap TAP below.

1) When the Length L' of the Tap TAP is Sufficiently Small Against the Thickness T of the Isolation Layer STI (L'<<T)

In this case, the parasitic resistance r1 of the resistor 102 in the longitudinal direction is relatively negligible to the parasitic resistance rd of the resistor 102 in the depth direction. Therefore, the terminal parasitic-resistance Rt0 is inversely proportional to the length L' of the tap TAP. In the model formula (1) according to the first exemplary embodiment, when setting the fitting parameter $L'_0$ to a similar value to the thickness T of the isolation layer STI, L'<<$L'_0$ is established.

Then, $(L'+L'_0)/L' \approx L'_0/L'$ is established. Therefore, in this case, the terminal parasitic-resistance Rt0 is considered to be inversely proportional to L'.

2) When the Length L' of the Tap TAP is not Sufficiently Small Against the Thickness T of the Isolation Layer STI When the length L' of the tap TAP increases to an extent, the terminal parasitic-resistance Rt0 scarcely decreases by influence of the parasitic resistance r1 of the resistor 102 in the longitudinal direction. Specifically, the terminal parasitic-resistance Rt0 is to approach a constant value.

Figure 3:
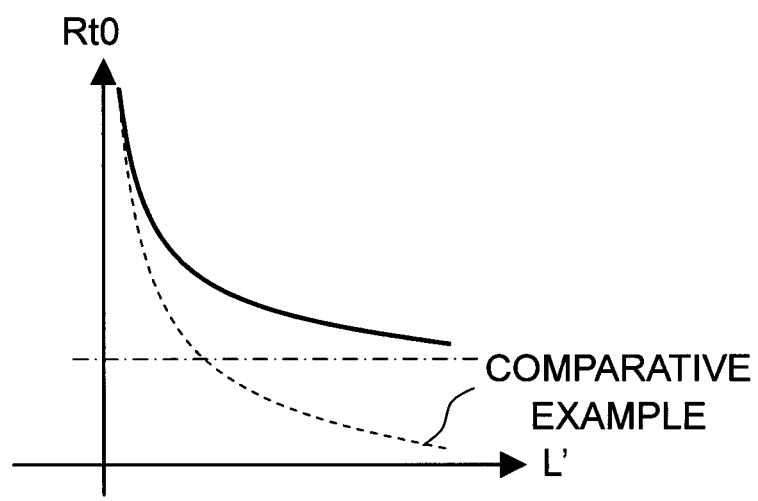
FIG. 3 is a graph schematically showing the dependency of the terminal parasitic-resistance Rt0 on the tap length L'.

FIG. 3 is a graph schematically showing the dependency of the terminal parasitic-resistance Rt0 on the tap length L'. A broken line represents the formula (2) of the comparative example. Here, the terminal parasitic-resistance Rt0 is proportional to the length L' of the tap TAP. Specifically, in the formula (2) of the comparative example, when the length L' of the tap TAP approaches infinity, the terminal parasitic-resistance Rt0 approaches zero. This does not match the actual change of the terminal parasitic-resistance Rt0.

On the other hand, a solid line of FIG. 3 represents the model formula (1) according to the first exemplary embodiment. In the model formula (1) according to the first exemplary embodiment, when the length L' of the tap TAP approaches infinity, $(L'+L'_0)/L'$ approaches one, that is, converges on a constant value. This matches the actual change of the terminal parasitic-resistance Rt0. Here, to adjust the convergence value of the terminal parasitic-resistance Rt0, the fitting parameter $\rho_0$ is set to an appropriate value. Therefore, fitting parameter $\rho_0$ is not necessary to be resistivity in physics.

As mentioned above, in the model formula of a circuit simulation method according to the first exemplary embodiment, fitting parameters $W'_0$, $L'_0$, $\rho_0$ are introduced based on physics consideration. This makes it possible to estimate the terminal parasitic-resistance Rt0 precisely. Further, since a terminal parasitic-resistance net may be expressed as a single terminal parasitic-resistance Rt0, the number of nodes is reduced. This makes it possible to reduce circuit simulation time. In the model formula (1) according to the first exemplary embodiment, the values of the fitting parameters $W'_0$, $L'_0$, $\rho_0$ are determined by fitting comparing calculation results with measured values, finally. Therefore, it is not necessary to distinguish the resistor 102 (well) from the tap TAP in the terminal region.

Figure 4:
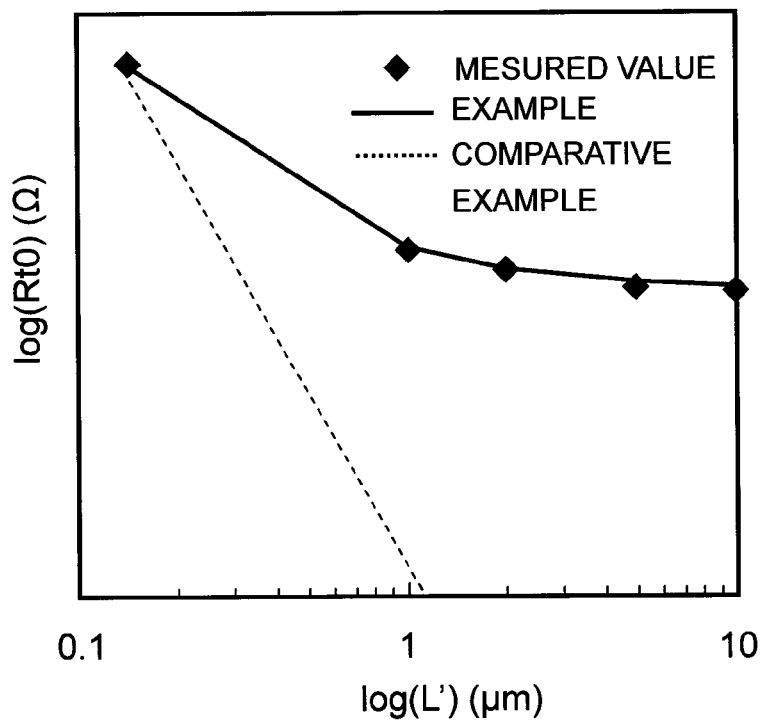
FIG. 4 is a graph showing measured values and simulation results obtained by circuit simulation methods according to an example and a comparative example of the first exemplary embodiment.

Next, simulation results obtained by a circuit simulation method according to the first exemplary embodiment is described hereinafter with reference to FIG. 4. FIG. 4 is a graph showing measured values and simulation results obtained by circuit simulation methods according to an example and a comparative example of the first exemplary embodiment. The horizontal axis represents logarithmic values of the length L' (μm) of the tap TAP and the vertical axis represents logarithmic values of the terminal parasitic-resistance Rt0 (Ω).

Further, in FIG. 4, solid diamond symbols represent measured values of the terminal parasitic-resistance Rt0, a solid line represents an example of the circuit simulation method according to the first exemplary embodiment, and a broken line represents a comparative example. As mentioned above, the formula (2) is applied to the comparative example. In the comparative example, the terminal parasitic-resistance Rt0 is considered to be inversely proportional to the length L' of the tap TAP.

As shown in FIG. 4, the model formula (1) according to the first exemplary embodiment which is applied to the example matches the measured values highly precisely. On the other hand, the comparative example largely deviates from the measured values as the length L' of the tap TAP increases. Specifically, the estimation error of the terminal parasitic-resistance Rt0 increases. This is because the parasitic resistance r1 of the resistor 102 in the longitudinal direction is not considered in the comparative example. Specifically, when the length L' of the tap TAP increases, the region of the resistor 102 under the tap TAP far from the main body of the resistor 102 does not contribute to reducing the terminal parasitic-resistance Rt0.

Second Exemplary Embodiment

Next, a circuit simulation method according to a second exemplary embodiment is described hereinafter. Usually, the distance F between the tap TAP and the side wall of the resistor 102 shown in FIG. 1B is a fixed value. Thus, the distance F between the tap TAP and the side wall of the resistor 102 is a fixed value in the above-mentioned model formula (1) according to the first exemplary embodiment. However, it may be variable.

As mentioned above, according to physics consideration about the fitting parameter $W'_0$ of the model formula (1), the fitting parameter $W'_0$ is easily considered as a function of the distance F. Here, assuming the fitting parameter $W'_0$ as a quadratic function of the distance F or $W'_0 = a_0 + a_1 \times F + a_2 \times F^2$ in the model formula (1) according to the first exemplary embodiment, for example, the following formula (3) which is a model formula according to the second exemplary embodiment is obtained. Here, $a_0$, $a_1$, and $a_2$ are fitting parameters.

$$Rt0 = \frac{\rho_0 \times (L' + L'_0)}{L' \times (W' + a_0 + a_1 \times F + a_2 \times F^2)} \quad (3)$$

Figure 5:
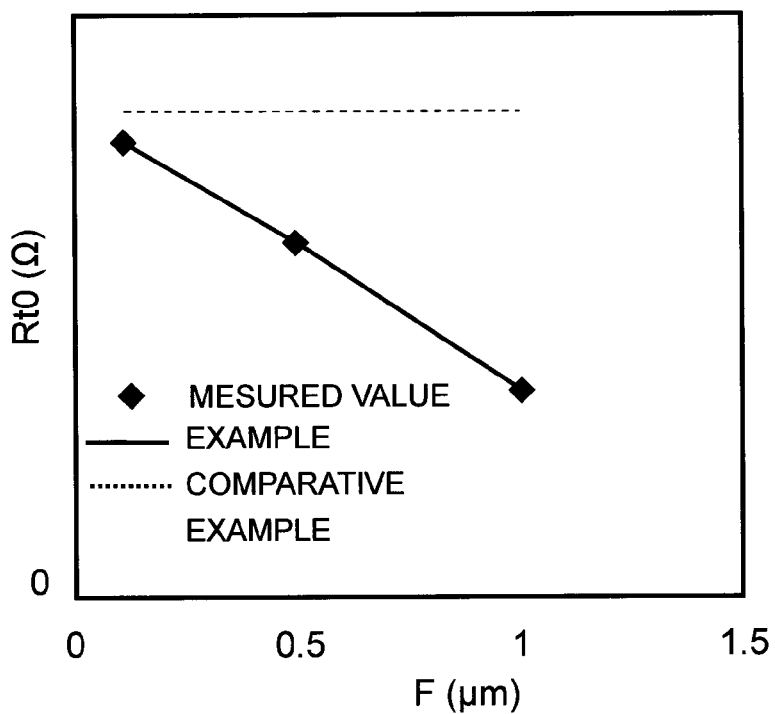
FIG. 5 is a graph showing measured values and simulation results obtained by circuit simulation methods according to an example and a comparative example of the second exemplary embodiment.

Next, simulation results obtained by a circuit simulation method according to the second exemplary embodiment is described hereinafter with reference to FIG. 5. FIG. 5 is a graph showing measured values and simulation results obtained by circuit simulation methods according to an example and a comparative example of the second exemplary embodiment. The horizontal axis represents the distance F (μm) and the vertical axis represents the terminal parasitic-resistance Rt0 (Ω).

Further, in FIG. 5, solid diamond symbols represent measured values of the terminal parasitic-resistance Rt0, a solid line represents an example of the circuit simulation method according to the second exemplary embodiment, and a broken line represents a comparative example. As mentioned above, since the formula (2) applied to the comparative example is not a function of the distance F, it has a constant value independently from the distance F.

As shown in FIG. 5, the model formula (3) according to the second exemplary embodiment which is applied to the example matches the measured values highly precisely. Although a physical sense that the fitting parameter $W'_0$ is expressed by a quadratic function of the distance F between the tap TAP and the side wall of the resistor 102 remains incompletely understood, the model formula (3) matches measured values precisely as above mentioned.

Third Exemplary Embodiment

Figure 6A:
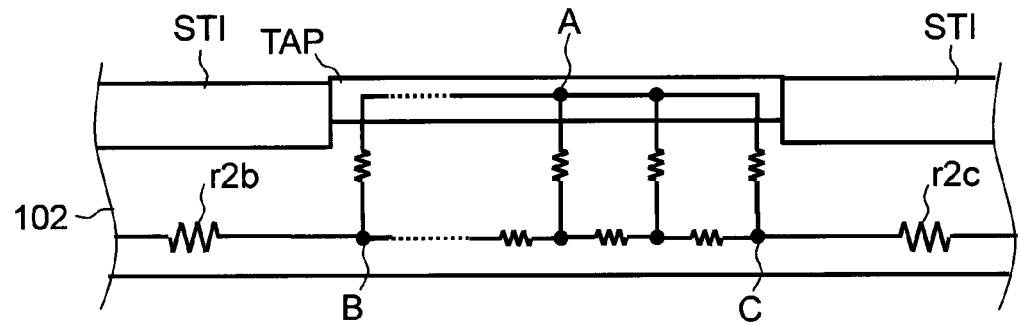
FIG. 6A is a longitudinal sectional view for explaining a terminal parasitic-resistance of a semiconductor resistor which is modeled in a circuit simulation method according to a third exemplary embodiment.
Figure 6B:
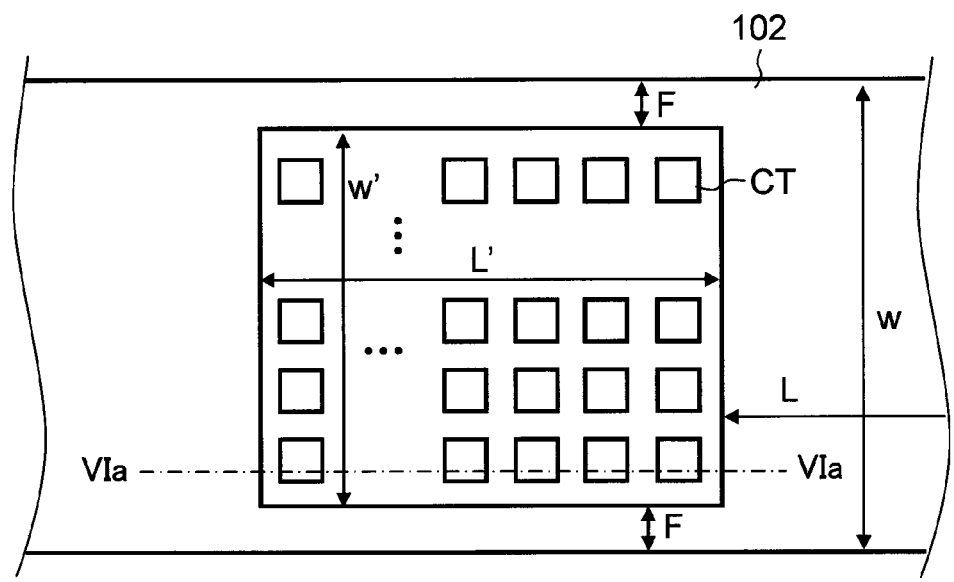
FIG. 6B is a plan view for explaining a terminal parasitic-resistance of a semiconductor resistor which is modeled in the circuit simulation method according to the third exemplary embodiment.

Next, a terminal parasitic-resistance of a semiconductor resistor which is modeled in a circuit simulation method according to the third exemplary embodiment of the present invention is described hereinafter with reference to FIGS. 6A to 6C. FIG. 6A is a longitudinal sectional view for explaining a terminal parasitic-resistance of a semiconductor resistor which is modeled in the circuit simulation method according to the third exemplary embodiment. FIG. 6B is a plan view for explaining the terminal parasitic-resistance of the semiconductor resistor which is modeled in the circuit simulation method according to the third exemplary embodiment. Further, FIG. 6A is a longitudinal sectional view taken along the line VIa-VIa of FIG. 6B.

In the first exemplary embodiment, the modeled terminal regions are formed at ends of the resistor 102. On the other hand, in the third exemplary embodiment, the modeled terminal region is formed at a center region of the resistor 102. Specifically, the resistor 102 forms a ladder resistor structure composed of the resistances r2b and r2c, and the modeled terminal region is formed at a node connecting the resistance r2b to the resistance r2c. Other structures are similar to those in the first exemplary embodiment, and thus description thereof will be omitted. Also in the third exemplary embodiment, the same effects as those of the first exemplary embodiment are obtained.

Figure 6C:
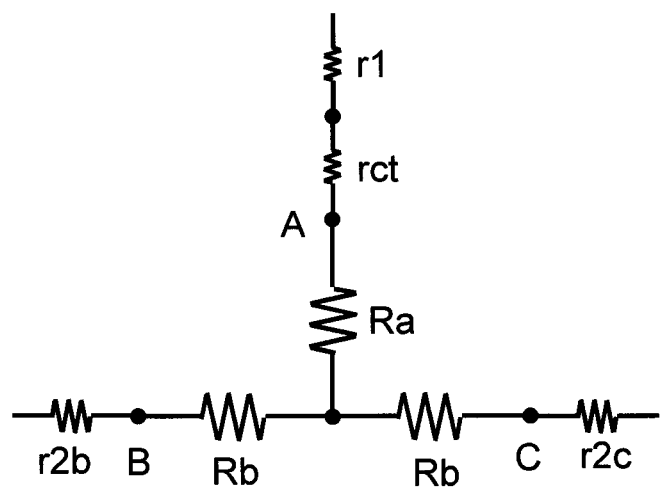
FIG. 6C is an equivalent circuit diagram of a terminal region of a semiconductor resistor which is modeled in the circuit simulation method according to the third exemplary embodiment.

FIG. 6C is an equivalent circuit diagram of the terminal region of the semiconductor resistor which is modeled in the circuit simulation method according to the third exemplary embodiment. As shown in FIG. 6C, the equivalent circuit diagram of the terminal region of the resistor 102 according to the third exemplary embodiment includes a node A connecting the terminal region to one end of the total resistance rct of the contacts CT, a node B connecting the terminal region to the resistance r2b of the main body of the resistor 102, and a node C connecting the terminal region to the resistance r2c of the main body of the resistor 102. Therefore, the terminal parasitic-resistance is not expressed as a single resistance, and is expressed by two resistances $R_a$ and $R_b$. Further, the other end of the total resistance rct of the contacts CT connects to the resistance r1 of the main body of the wiring line 101.

Next, a method for deriving a model formula used for a circuit simulation method according to the third exemplary embodiment is described hereinafter. A resistance between the nodes A and B is expressed as $R_{AB}$ or the like when focusing only on the nodes A and B. Then, in the equivalent circuit shown in FIG. 6C, the resistances $R_a$ and $R_b$ are expressed as the following formula (4).

$$\begin{cases} R_a = R_{AB} - \frac{R_{BC}}{2} \left( = R_{AC} - \frac{R_{BC}}{2} \right) \\ R_b = \frac{R_{BC}}{2} \end{cases} \quad (4)$$

In short, the resistances $R_{AB}$, $R_{AC}$, and, $R_{BC}$ are to be solved. With regard to the resistances $R_{AB}$ and $R_{AC}$, naturally, the formula (1) in the first exemplary embodiment is true. Thus, the following formula (5) is obtained.

$$R_{AB} = R_{AC} = Rt0 = \rho_0 \times \frac{(L' + L'_0)}{L' \times (W' + W'_0)} \quad (5)$$

Next, the resistance $R_{BC}$ is calculated. With regard to the resistance $R_{BC}$ between the nodes B and C, it is considered to be equal to the resistance of the main body of the resistor 102. Specifically, when a sheet resistance of the main body of the resistor 102 is $\rho_s$, and a shrinkage amount of the width W of the resistor 102 by depletion layers formed near the both side walls of the resistor 102 is dW, the resistance $R_{BC}$ is expressed by the following formula (6). Here, the sheet resistance $\rho_s$ and the shrinkage amount dW can be measured.

$$R_{BC} = \frac{\rho_s \times L'}{W - 2dW} \quad (6)$$

According to the formulae (4), (5), and (6), a following model formula (7) expresses values of the resistances $R_a$ and $R_b$.

$$\begin{cases} R_a = \rho_0 \times \frac{(L' + L'_0)}{L' \times (W' + W'_0)} - \frac{\rho_s \times L'}{2 \times (W - 2dW)} \\ R_b = \frac{\rho_s \times L'}{2 \times (W - 2dW)} \end{cases} \quad (7)$$

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A simulation method for a semiconductor circuit comprising:
   a well resistor comprising a terminal region and a main body; and
   a plurality of contacts formed above the terminal region, the simulation method comprising:
     modeling a parasitic resistance Rt0 of the terminal region between the plurality of contacts and the main body by a first formula $$Rt0 = \rho_0 \times \frac{(L' + L'_0)}{L' \times (W' + W'_0)},$$

wherein $\rho_0$, $L'_0$, $W'_0$ are fitting parameters obtained by predetermined approximations of the formula to measured data of the well resistor;
   wherein L' is a length of the terminal region in a longitudinal direction of the well resistor; and
   wherein W' is a width of the terminal region in a width direction of the well resistor.

2. The simulation method according to claim 1,
   wherein the terminal region comprises a well defined by the main body and a tap formed on the well, and
   wherein the well and the tap are not distinguished in the modeling.

3. The simulation method according to claim 1,
   wherein the terminal region is formed at an end of the well resistor, and
   wherein the parasitic resistance Rt0 is modeled as an equivalent resistance composed of a single resistance series-connected between a resistance of the plurality of contacts and a resistance of the main body in the modeling.

4. The simulation method according to claim 1,
   wherein the terminal region is formed at a center of the well resistor, and
   wherein in the modeling, the parasitic resistance Rt0 is modeled as an equivalent resistance comprising:
     a first partial resistance $R_a$, one end of which is connected to the resistance of the plurality of contacts; and
     two second partial resistances $R_b$, one end of which is connected to the other end of the first partial resistance $R_a$ and the other end of which is connected to the main body formed at each side of the terminal region.

5. The simulation method according to claim 4,
   wherein the first partial resistance $R_a$ and the second partial resistances $R_b$ are modeled by a second formula $$\begin{cases} R_a = \rho_0 \times \frac{(L' + L'_0)}{L' \times (W' + W'_0)} - \frac{\rho_s \times L'}{2 \times (W - 2dW)} \\ R_b = \frac{\rho_s \times L'}{2 \times (W - 2dW)} \end{cases},$$

wherein $P_s$ is a sheet resistance value of the well resistor, and
   wherein dW is a shrinkage amount of the width of the well resistor.

$$\begin{cases} R_a = \rho_0 \times \frac{(L' + L'_0)}{L' \times (W' + W'_0)} - \frac{\rho_s \times L'}{2 \times (W - 2dW)} \\ R_b = \frac{\rho_s \times L'}{2 \times (W - 2dW)} \end{cases}$$

6. The simulation method according to claim 1, wherein the predetermined approximations are least square approximations.

* * * * *